United States Patent [19]

Gaasch et al.

[11] Patent Number: 5,755,548
[45] Date of Patent: May 26, 1998

[54] BELT DRIVE TUBE FEEDER FOR A SURFACE MOUNT PLACEMENT SYSTEM

[75] Inventors: Thomas Francis Gaasch, Carlsbad; Jerome Leonard Weber, Escondido, both of Calif.

[73] Assignee: Amistar Corporation, San Marco, Calif.

[21] Appl. No.: 773,575

[22] Filed: Dec. 27, 1996

[51] Int. Cl.$^6$ .................................................. B65G 65/23
[52] U.S. Cl. .......................... 414/415; 198/832.1; 414/403
[58] Field of Search .................................. 414/403, 415, 414/416; 198/832.1

[56] References Cited

U.S. PATENT DOCUMENTS

| | | | |
|---|---|---|---|
| 2,578,438 | 12/1951 | McInerney et al. | 198/832.1 X |
| 2,583,708 | 1/1952 | Rose | 198/832.1 X |
| 2,587,959 | 3/1952 | Biner | 198/832.1 X |
| 4,761,106 | 8/1988 | Brown et al. | 414/403 X |
| 4,952,113 | 8/1990 | Fujioka | 414/416 |
| 5,323,528 | 6/1994 | Baker | 29/721 |
| 5,328,317 | 7/1994 | Masui et al. | 414/403 |
| 5,503,299 | 4/1996 | Smith | 414/415 X |
| 5,628,605 | 5/1997 | Miyoshi | 414/403 X |
| 5,658,122 | 8/1997 | Ohashi et al. | 414/416 X |

*Primary Examiner*—David A. Bucci
*Attorney, Agent, or Firm*—Baker, Maxham, Jester & Meador

[57] ABSTRACT

A belt drive tube feeder for use in a surface mount placement system (SMPS) reliably advances a sequence of parts fed from a tube at a determinable sequential rate to a pick location on a belt assembly that includes one or more intermittently driven endless belts. Intermittent movement of the belts moves the parts along a track past a foot to the pick location. One part at a time is advanced to the pick location, with its immediate adjacent neighbor being clamped by the foot prior to the part being picked.

20 Claims, 10 Drawing Sheets

BELT DRIVE TUBE FEEDER FOR A SURFACE MOUNT PLACEMENT SYSTEM

BACKGROUND OF THE INVENTION

1. Field of the Invention

This invention relates to a tube feeder that operates in an assembly system by conveying parts to a location where they are picked by a vacuum quill for placement on a substrate, and particularly to a tube feeder that employs a belt drive to reliably advance parts to a pick location in a surface mount placement system that assembles electronic printed circuit boards.

2. Description of the Related Art

U.S. Pat. No. 5,323,528 describes an assembly system embodied as a surface mount placement system (SMPS) that automatically mounts parts on substrates. U.S. Pat. No. 5,323,528 which is assigned to the assignee of this application, is incorporated herein by reference. The parts include, for example, electronic and electrical components, while substrates may comprise, for example, printed circuit boards (PCB). The parts may also be considered workpieces.

The '528 patent discloses an SMPS in which parts are temporarily attached by a vacuum to the tip of a vacuum quill and held. The attachment and holding are referred to collectively as "picking". A picked part is transferred by the SMPS to a substrate, where the vacuum is released to "place" the part in a predetermined position for bonding to the substrate.

In the SMPS, the parts that are picked and placed must be quickly and reliably transported to a pick location. Typically for this purpose, parts are packaged in elongate tubes (also called "sticks"). Each tube carries a plurality of parts and is received, at the SMPS, in a tube feeder which receives parts discharged sequentially from the tube and transports the parts in sequence to a pick location.

In operation, a prior art tube feeder employs vibration to move parts out of a tube onto a vibrating feed track. Typically, a discharge end of the tube contacts the feed track. As the tube is emptied of parts, its mass changes, changing the magnitude and frequency of vibration. The change in vibration causes parts to move at different speeds to a pick location. This makes it difficult to synchronize the operation of an SMPS with the operation of prior art vibratory tube feeders.

SUMMARY OF THE INVENTION

Our invention is a tube feeder that receives a sequence of parts from a tube and reliably advances the parts at a determinable sequential rate to a pick location. Advantageously, our tube feeder dispenses with the vibratory mechanism of prior art tube feeders.

The tube feeder of the invention, which is operable in a surface mount placement system (SMPS), provides a sequence of parts contained in a tube to a pick location. The tube feeder includes a tube platform with a feeding end from which parts are fed from a tube to a track with a first end that receives parts, and a second end that provides the parts at the pick location. The first end of the track is positioned near the feeding end of the tube platform. A belt assembly moves parts from the first to the second end of the track. The belt assembly includes a belt drive for intermittently moving the belt assembly. A foot separates a part near the second end of the track from other parts on the belt assembly. An actuator lever pivots between a first and a second position and is coupled by a linkage to the belt drive assembly and to the foot for moving the belt assembly and operating the foot in response its rotation from the first to the second position. Operating the foot prevents overlapping of the part at the pick location by another part in the sequence being advanced to the pick location.

The tube feeder also includes a shutter moveable over the track between a first and second position while retaining part on the belt assembly between the foot and the second end. When the actuator lever is pivoted to the second position, the shutter is moved to its first position, where it retains a part at the pick location. When the actuator lever is pivoted from the second to the first position, the shutter is moved away from the second end, exposing the part for being picked by vacuum quill of the SMPS.

DETAILED DESCRIPTION OF THE PREFERRED EMBODIMENTS

With reference to the figures wherein like reference numerals indicate the same parts, there is shown, particularly in FIGS. 1–5, a tube feeder 10 that includes a mounting plate 12 carrying on its forward lower and lower front edges blocks 14 and 16 on which are mounted conventional threaded assemblies for mounting the tube feeder 10 in an assembly system such as a surface mount placement system (SMPS). The tube feeder 10 includes a tube platform 18 on which a tube with parts, such as electronic components, is mounted with its rear end elevated with respect to its front end so that parts contained therein slide under the force of gravity, out of a feeding end of the tube that rests on the tube platform 18 near the feeding end 20 of the tube platform. A rear pivoting retainer clamp 22 with clamp jaws 23 is mounted on the tube platform 18 to clamp the rear end of the tube, while a forward pivoting retainer clamp 24 with clamp jaws 25 is mounted on the tube platform 18 to retain the front end of a tube. A tube is represented with respect to the tube platform 18 by the dashed line 26. An arrow 27 indicates the clockwise direction that the retainer clamp 22 pivots on a pin 28 in order to receive and retain the rear end of the tube. The arrow 30 indicates the counter clockwise rotation of the front end of the forward retainer clamp 24 that is necessary to receive and retain the feed end of a tube.

The feeding end 20 of the tube platform feeds a sequence of parts, such as electronic components contained in a tube, to a track having a first end 32 and a second end 33. With reference to FIGS. 1, 3, 4, and 5, the track comprises a spaced-apart pair of rails 34a and 34b on the outside of which are mounted, respectively, retainer plates 35a and 35b. Each retainer plate is held to a respective track rail by threaded screws. For the track rail and retainer plate 34a and 35a, six such screws are indicated by reference numeral 36 in FIG. 1. Alternatively, the entire track may be machined from one piece.

Figure 3:
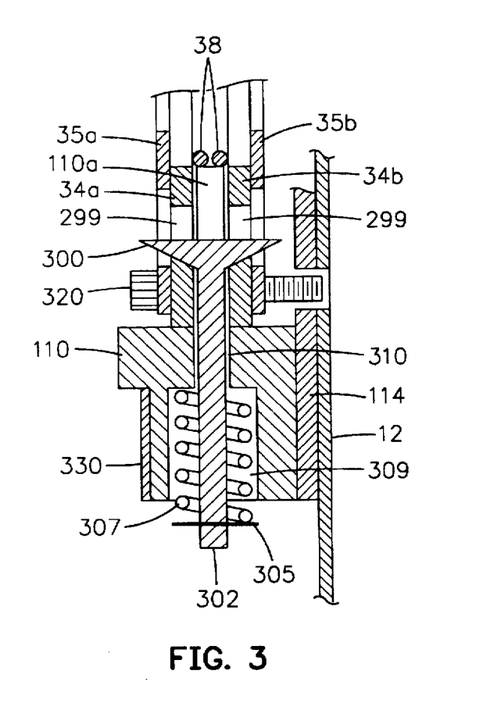
FIG. 3 is a sectional view taken along 3—3 of FIG. 1.
Figure 4:
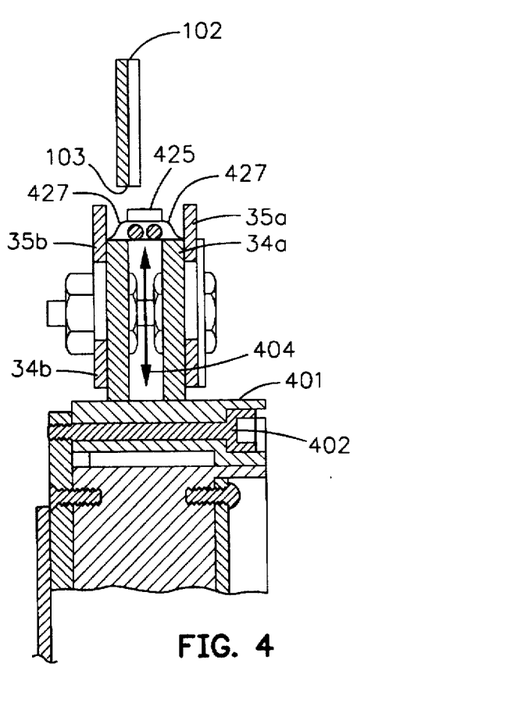
FIG. 4 is a sectional view taken along 4—4 of FIG. 1.

A belt assembly 38 is substantially centered between the track rails 34a and 35b. As best seen in FIGS. 3 and 4, the belt assembly 38, in the preferred embodiment, includes two endless belts, although, one, or more than two belts may be used as dictated by the requirements of the design. Further, although the belts in the preferred embodiment have a generally circular cross-section, the inventors contemplate that any appropriate cross-section may be used. The belt assembly 38 is engaged to a belt drive pulley 40 having a clutch assembly that permits rotation in a clockwise direction (in FIG. 1), but which prevents rotation in the opposite direction. The belt assembly 38 is engaged at the front end of the tube feeder 10 over a front pulley 42.

A foot 46 is shown in FIGS. 2, 6A–6C and 7A–7C. The foot 46 is situated near the second end 33 of the track. The purpose of the foot 46 is to prevent over-lapping of mold flash on the ends of parts which, as between adjacent parts, can interfere with or prevent pick of one of the parts. The foot 46 operates to separate a part at a pick location between the foot 46 and the second end 33 of the track from the remainder of the parts on the belt drive. The foot 46 pivots in a first direction to release a part that is advanced by the belt drive 38 to the pick location and then pivots oppositely to move back and down to push a second part immediately following the part at the pick location back and away from the second end 33, clamping the second part against the track rails 34a and 34b.

An actuator lever 48 includes first, second and third actuator lever arms 49, 50 and 51. The actuator lever 48 is pivoted on an actuator lever pivot pin 53 that is fixed to the mounting plate 12.

The third arm 51 of the actuator lever 48 is coupled by a linkage to the belt drive pulley 40 and the foot 46. The linkage moves the belt assembly 38 and operates the foot 46 in response to the actuator lever 48 being pivoted between a first position and a second position, as explained more fully hereinafter.

Figure 1:
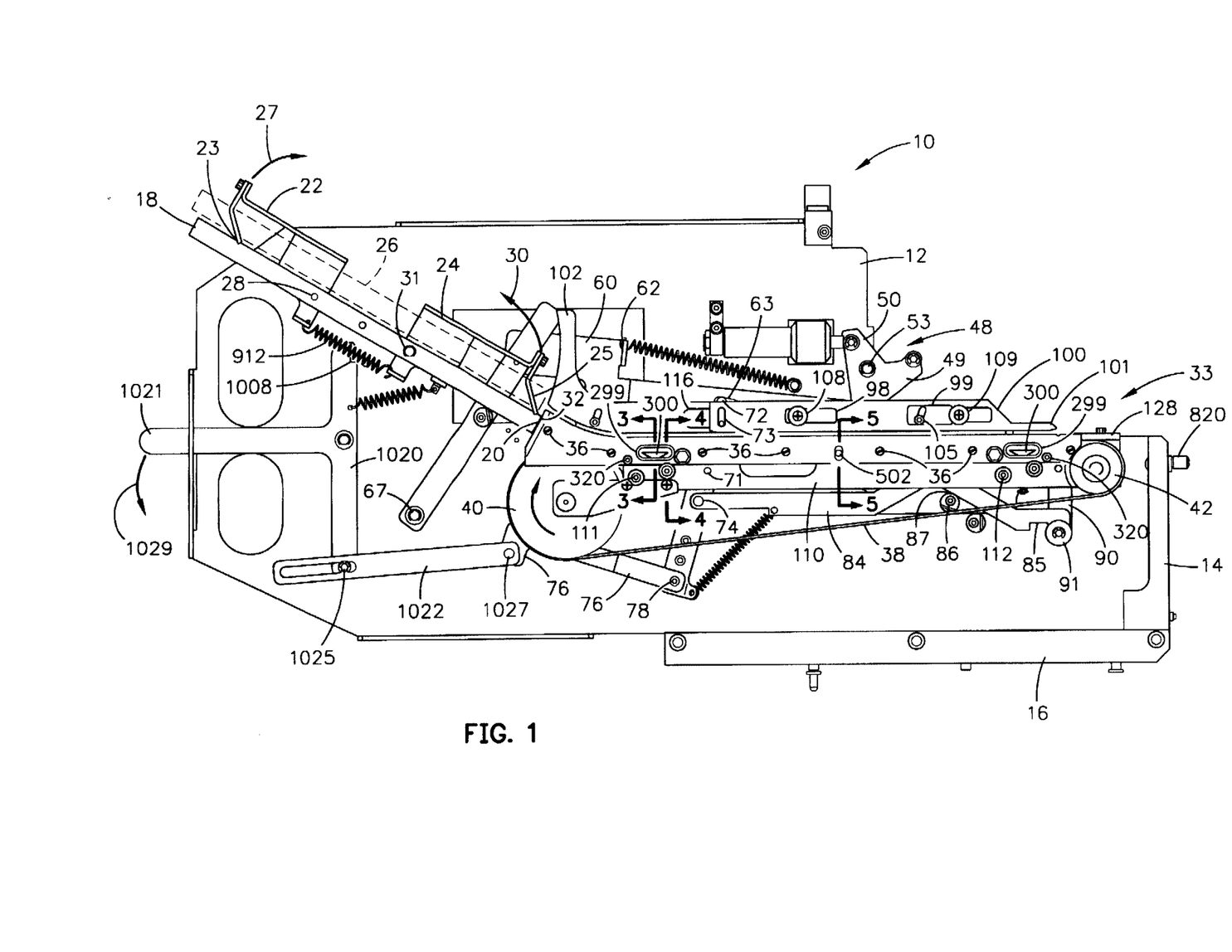
FIG. 1 is a side elevation illustrating a tube feeder embodying the principles of this invention.
Figure 2:
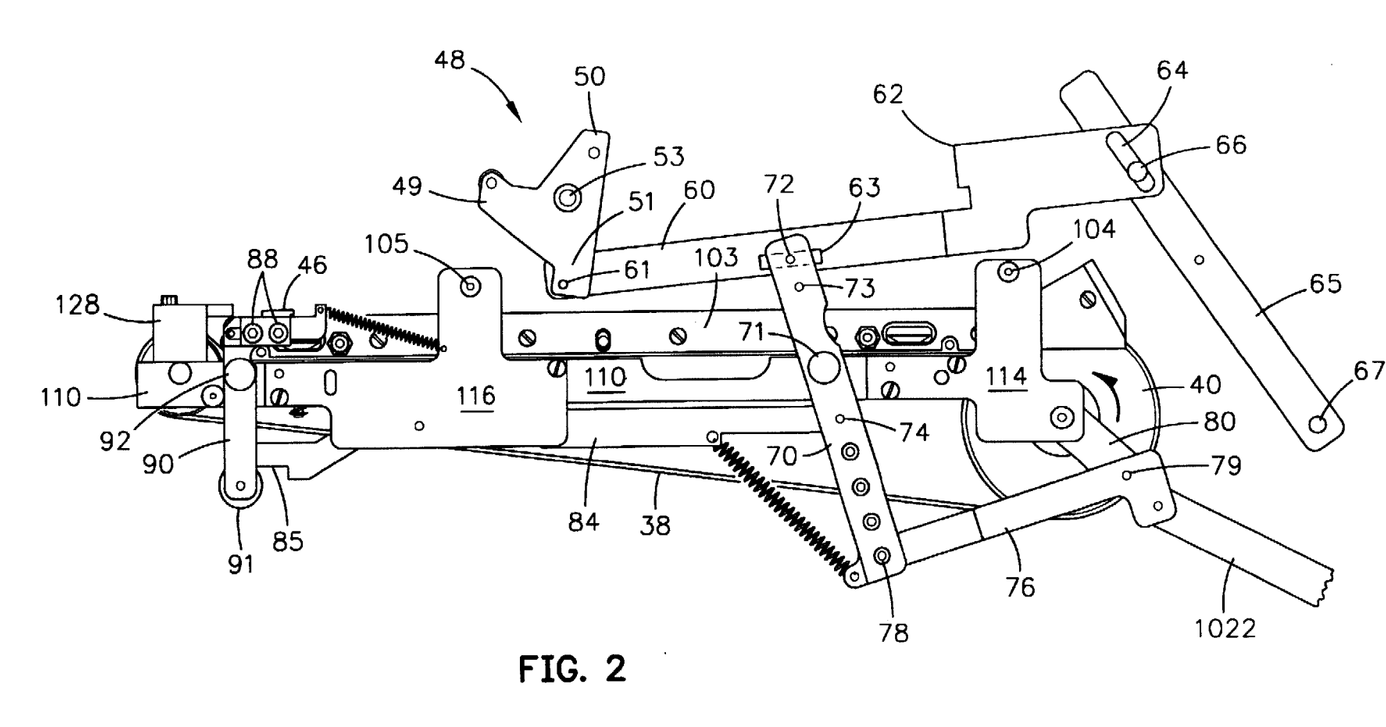
FIG. 2 is a side elevation view of the back of the tube feeder illustrated in FIG. 1, with a mounting plate removed to show a linkage assembly.

The linkage is best seen in FIGS. 1 and 2. The linkage includes a first linkage arm 60 that is pivotally connected by a pivot pin 61 to the third arm 51 of the actuator lever 48. The first linkage arm 60 has a flange 62, a slot 63 approximately at its midpoint, and a slot 64 at an end opposite the end that is coupled to the third actuator lever arm 51. A second linkage arm 65 includes a gudgeon 66 that engages the slot 64 of the first linkage arm 60. The second linkage arm 65 is pivoted at a pivot pin 67 that is mounted on the mounting plate 12. A third linkage arm 70 is pivoted on a fixed pivot pin 71 that is mounted to a track block 110 explained in more detail below. At the upper end of the third linkage arm 70, a first gudgeon 72 is mounted to engage the slot 63 of the first linkage arm 60. A second gudgeon 73 is mounted on the third linkage arm 70, where it engages a slot on a shutter, discussed later. A pivot pin 74 is mounted on the third linkage arm 70 immediately below where the pivot pin 71 engages the arm 70. A clutch linkage arm 76 is connected by a pivot pin 78 (one of four possible pivot pins) to the lower end of the third linkage arm 70. A pivot pin 79 connects the clutch linkage arm 76 with a clutch arm 80. The clutch arm 80 engages a clutch mechanism that is an integral part of the belt drive pulley 40. A foot linkage arm 84 is connected to the third linkage arm 70 by the pivot pin 74. The forward end of the foot linkage arm 84 includes a hook 85. Immediately behind the hook 85, the foot linkage arm 84 engages an eccentric gudgeon 86 on a cam surface 87 of the foot linkage arm 84. The foot 46 is mounted on and rotates with one end of a foot arm 90, the other end of which carries a hook bushing 91. The foot arm 90 pivots on a pivot pin 92 that is mounted to a track block 110 (explained in more detail below).

Figure 6A:
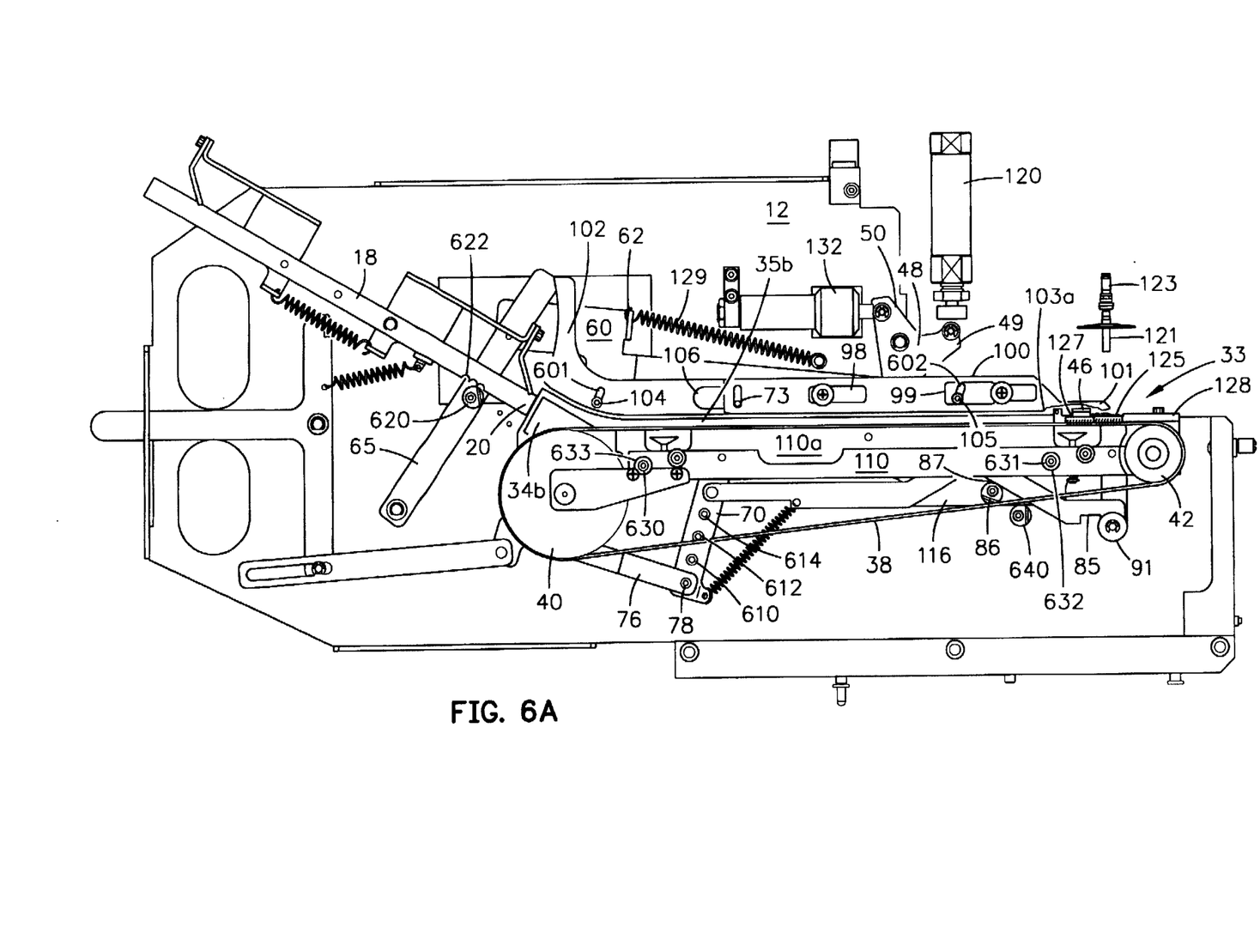
FIGS. 6A, 6B, and 6C are side elevation views corresponding to FIG. 1, with details removed to illustrate synchronized operation of a shutter and foot.

With reference to FIGS. 1 and 6A, an elongate shutter 100 with slots 98 and 99, and a shutter tip 101, is slidably mounted to a stationary top guide 102. The top guide 102 includes an edge 103 that is positioned above the track and the belt assembly 38, substantially from the first end 32 of the track to a location short of the foot 46. The foot 46 is therefore positioned between the second end 33 of the track and a far end 103a of the top guide 102. Bushing/screw assemblies 108 and 109 slidably attach the shutter 100 to the stationary top guide 102. A track block 110 and first and second spacer plates 114 and 116 (both seen in FIG. 2) are fixed by screws 111 and 112 to the mounting plate 12. The eccentric gudgeon 86 is also mounted to the second spacer plate 116. The screws 104 and 105 attach the top guide 102 fixedly to the mounting plate 12, extending through the spacer plates 114 and 116. The spacer plates 114 and 116 set the track block 110 off the mounting plate in order to provide space between the mounting plate 12 and the track block 110 for the linkage arms 70 and 90 to move.

Operation

Figure 6B:
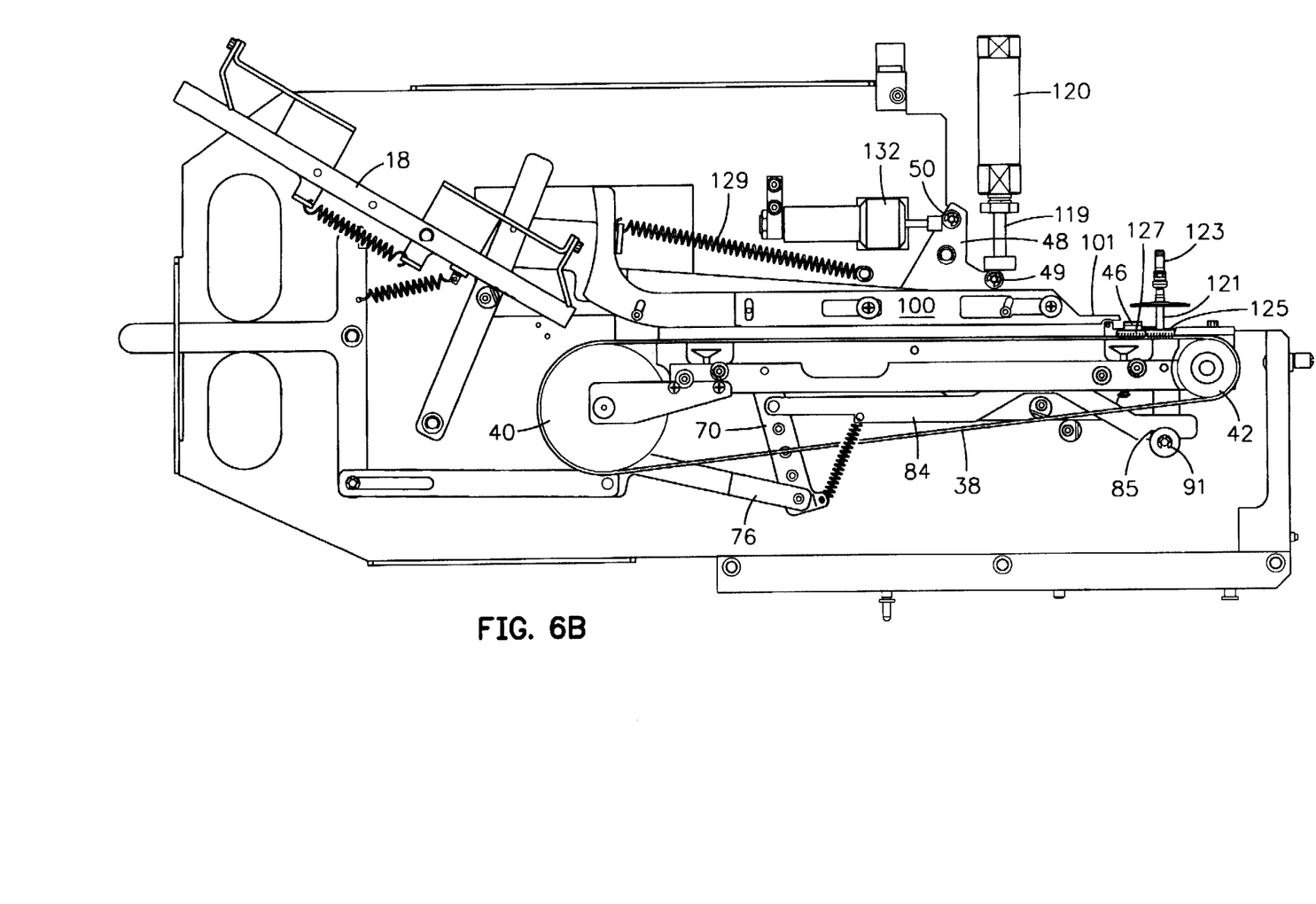
Figure 6C:
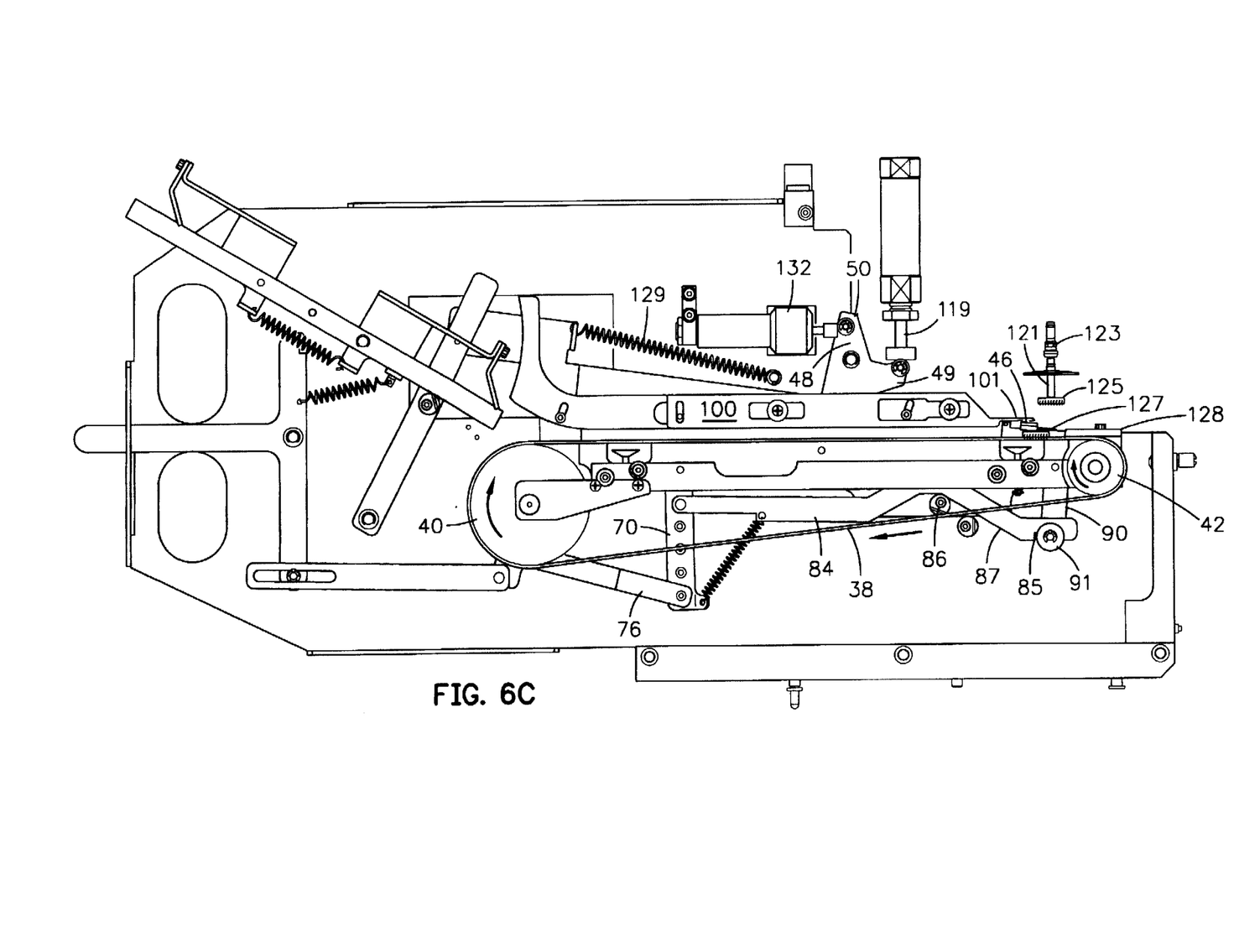
Figure 7A:
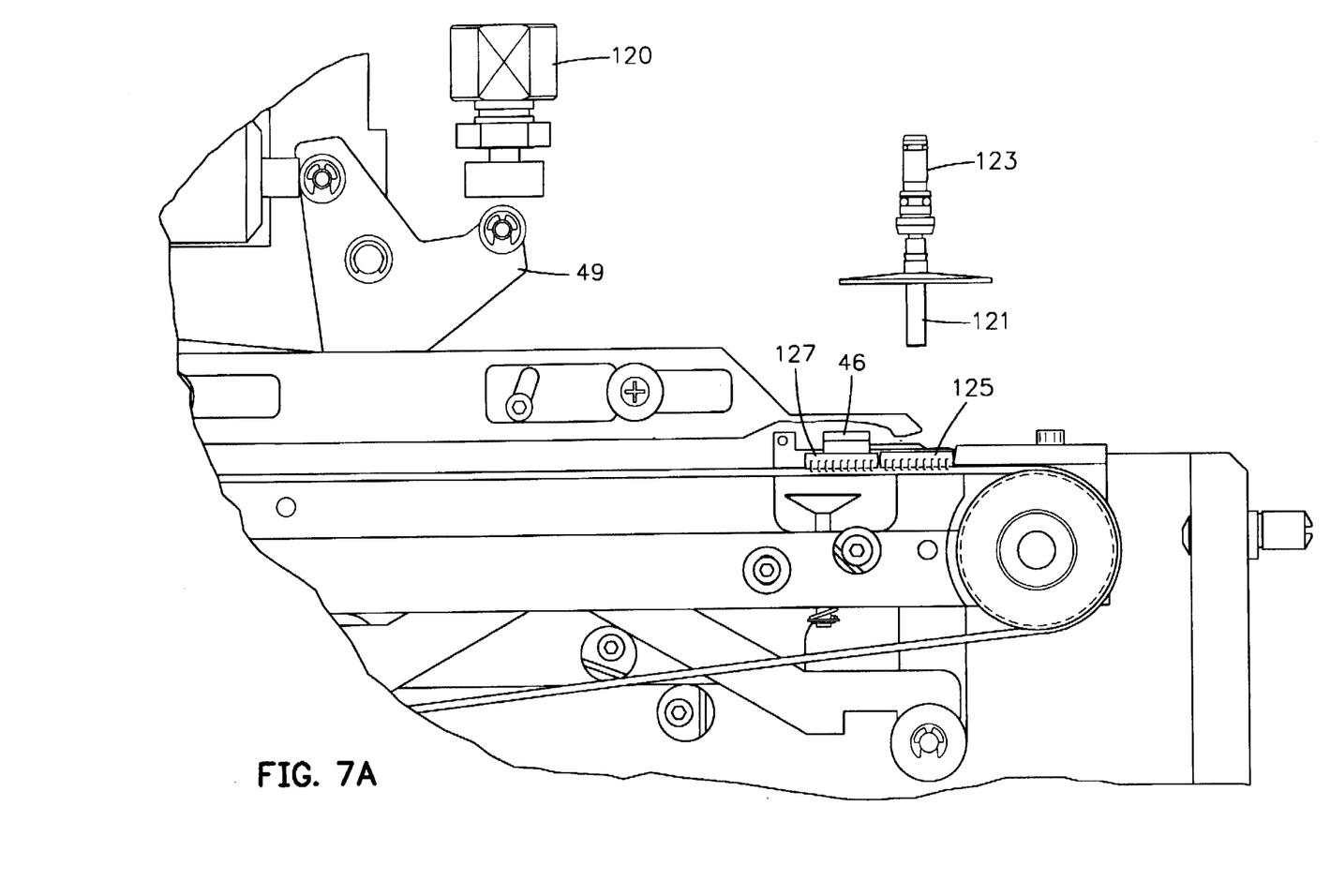
FIGS. 7A, 7B, and 7C are respective magnified portions of FIGS. 6A, 6B and 6C.
Figure 7B:
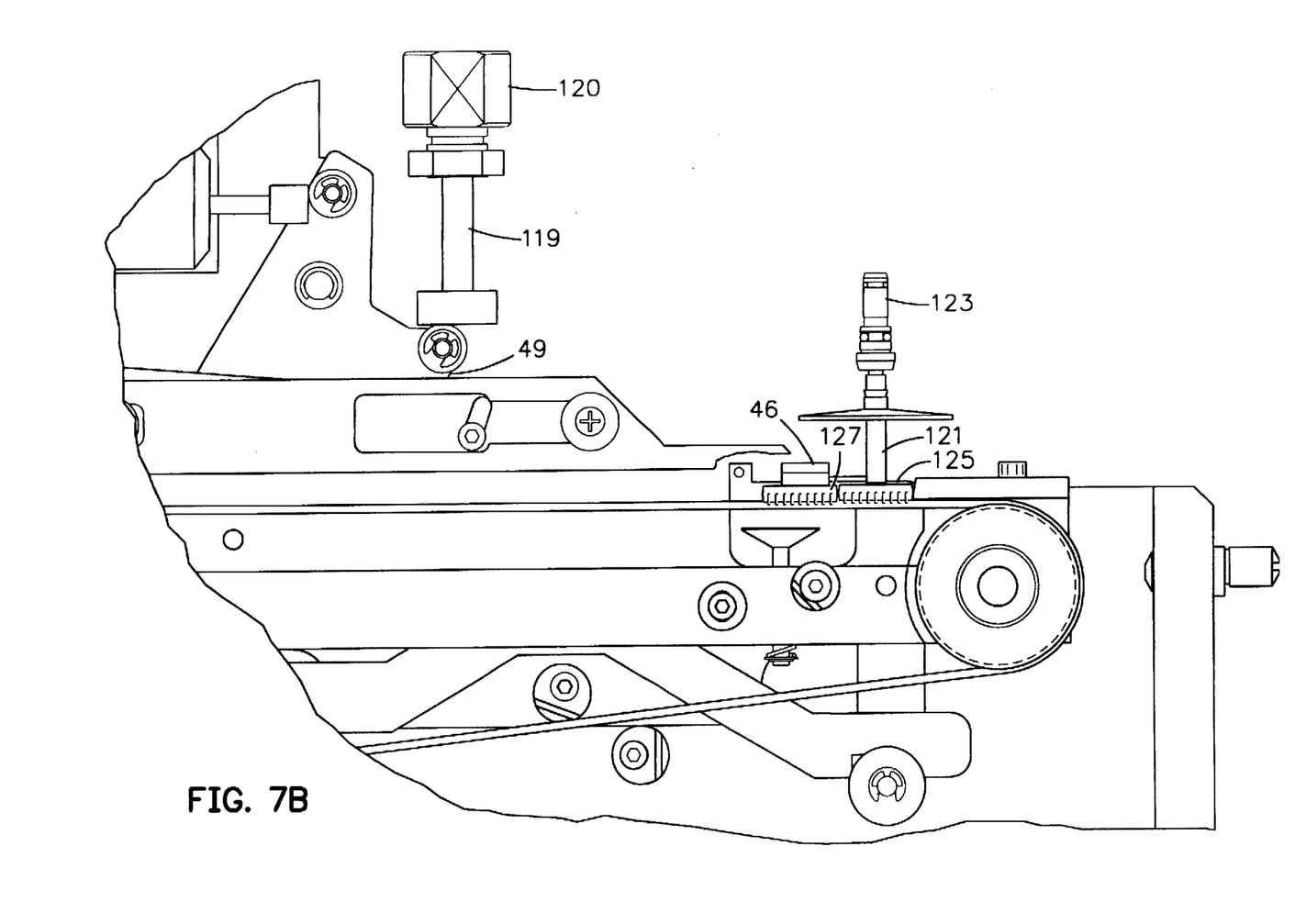
Figure 7C:
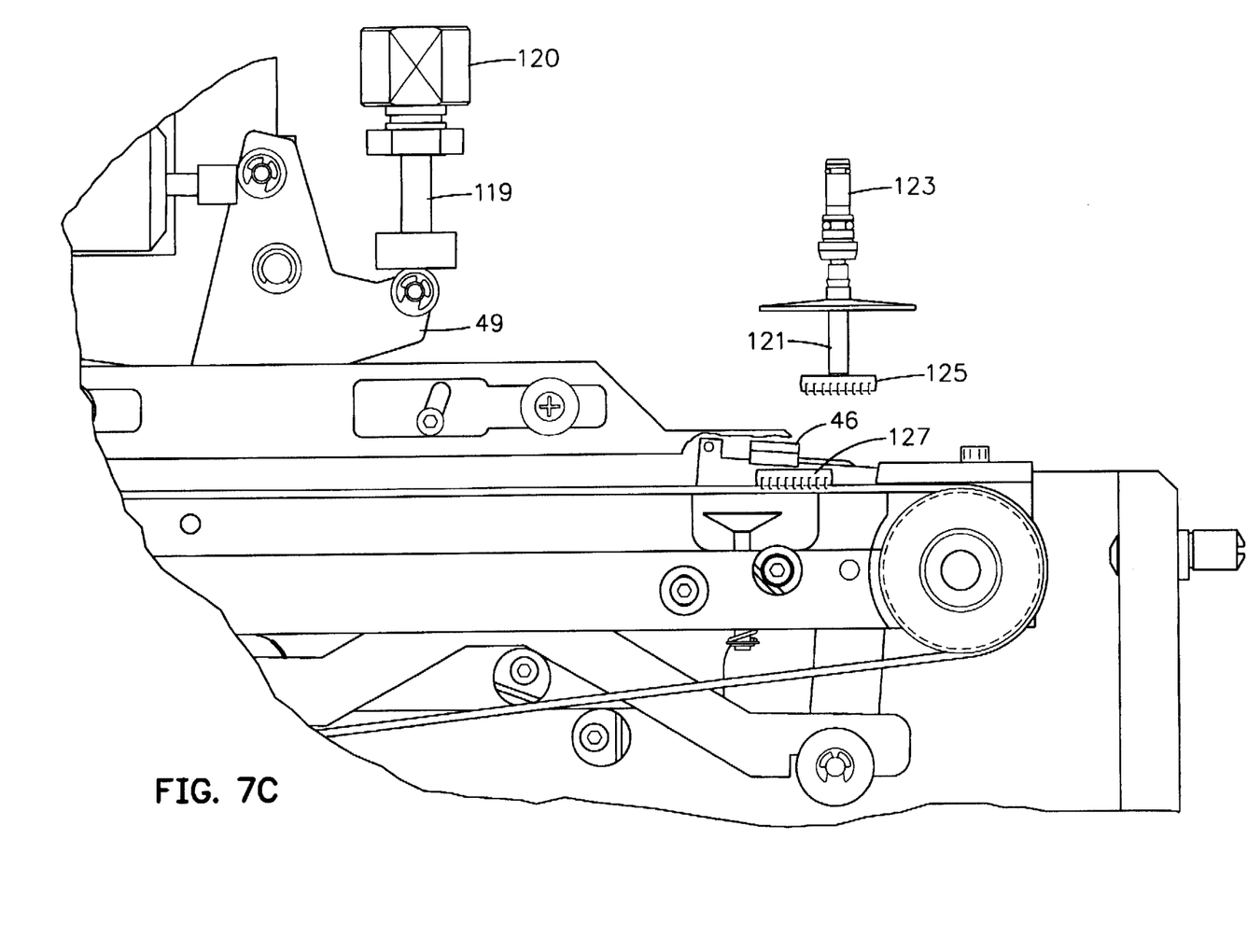

The operation of the tube feeder 10 is shown in detail in FIGS. 6A–6C and 7A–7C. In these figures, FIG. 7A is a magnified view of a portion of FIG. 6A. FIG. 7B magnifies a portion of FIG. 6B, and FIG. 7C magnifies a portion of FIG. 6C. In all of these figures, the track rail 34a and the retainer plate 35a have been removed in order to illustrate a cycle of operation of the tube feeder 10. For the same reason, the shutter tip 101 has been partly cut away in these figures on its lower edge. FIGS. 6A and 7A show an actuator 120, and a vacuum tip 121 on the end of a vacuum quill 123. Both of the mechanisms 120, 121, are found, for example, in an SMPS, such as that illustrated and described in the incorporated patent. The actuator 120 and vacuum quill 123 are operated conventionally by the SMPS. In FIGS. 6A and 7A two parts 125 and 127 represent one end of a sequence of parts fed by the belt assembly 38 toward the second end 33 of the track. The part 125 is positioned at a pick location, its leading edge contacting and retained by a stop 128 that is fixed to the track block 110. The foot 46 is clamped down on the top surface of the part 127, retaining the part 127 on the track slightly behind the part 125. The shutter tip 101 extends somewhat more than halfway over the part 125, retaining it on the belt assembly 38 at the pick location. A spring 129 is fixed at one end to the mounting plate 12 and coupled at its other end to the flange 62 of the first linkage arm 60. The spring 129 is slightly extended, thereby exerting a force on the flange 62 directed generally toward the second end 33 of the track.

Assume now, with reference to FIGS. 6A, 6B and 7A, 7B, that the SMPS executes a drive stroke in which the actuator 120 is activated to drive its plunger 119 against the first actuator lever arm 49. This rotates the actuator lever 48 in the clockwise direction to a first position. Rotation of the actuator lever 48 to the first position drives the first linkage arm 60 against the tension of the string 129, toward the tube platform 18. As the second lever arm 70 rotates, the gudgeon 73 pulls the shutter 100 rearwardly toward the first end 32 of the track. This moves the tip 101 away from the part 125, clearing the top of the part immediately before the vacuum tip 121 is brought against it. In this, the end of the drive stroke of the SMPS, the foot 46 still clamps the part 127 against the belt assembly 38. At this point the actuator lever 48 and the shutter 100 are at their respective first positions.

The rotation of the second linkage arm 70 to the position shown in FIGS. 6B and 7B has moved the foot linkage arm 84 forward to engage the hook 85 on the hook bushing 91. Furthermore, the clutch linkage arm 76 and, with it, the clutch arm 80, have been pulled forwardly by the rotation of the second linkage arm 70. Movement in this direction does not engage the clutch assembly; therefore the belt drive pulley 40, and the belt assembly 38, remain stationary.

In a return stroke of the SMPS (shown in FIGS. 6B, 6C and 7B, 7C), the actuator plunger 119 and vacuum quill 123 are drawn upwardly, allowing the extended spring 129 to pivot the actuator lever 48 from its first, to its second position (in the counter clockwise direction from FIG. 6B to FIG. 6C) by way of the first linkage arm 60. This also pivots the second linkage arm 70 in the clockwise direction in FIGS. 6C and 7C, returning it to the position shown in FIG. 6A. As the second linkage arm 70 pivots, it draws the foot linkage arm 84 with it. With the hook bushing 91 engaged by the hook 85, the foot arm 90 is pulled rearwardly (clockwise in FIG. 6C) thereby pivoting the foot 46 upwardly off the part 127. As the foot linkage arm 84 travels rearwardly, the surface 87 contacts the eccentric gudgeon 86, raising the hook 85 off of the hook bushing 91. At the same time that the hook 85 is being disengaged from the bushing 91, the clutch linkage arm 76 is driving the belt drive pulley 40 in the direction that engages the clutch and causes the pulley 40 to rotate (clockwise in FIG. 6C). This moves the belt assembly 38, transporting the now-free part 127 from under the now-raised foot 46 to the pick location against the stop 128. As this occurs, another part behind the part 127 will be clamped by the foot 46 as in FIGS. 6A and 7A when the hook bushing 91 is fully disengaged from the hook 85. The shutter 100 also operates on the return stroke from FIG. 6C to FIG. 6A, traveling over the top of the part 127 until it comes to rest in the pick location where the tip 101 will have the retaining relationship with the part 127 that it has with the part 125 in FIG. 6A.

To complete the description of operation, the actuator lever 48 is rotated to its first position, represented by the transition from FIG. 6A to 6B, during which its rotation causes retraction of the shutter 100 to its first position, thereby allowing the part 125 to be picked. Further, in the return stroke from FIG. 6B, through FIG. 6C, to FIG. 6A, the actuator lever 48 rotates to its second position (FIG. 6A), causing the foot to operate as described above and the shutter 100 to return to its second position where it retains the part on the track between the foot 46 and the second end 33.

Additional Features

A damper, or shock absorber 132 engages the second actuator lever arm 50 to buffer and thus slow down, the speed with which the actuator lever 48 is rotated to its second position on the return stroke. This controls the rate at which the actuator lever 48 is pivoted to its second position on the return stroke, reducing the effect of inertia of parts being advanced toward the foot 46 on the belt assembly 38, and causing the parts to move with the belt assembly 38, without sliding.

The tube feeder 10 is highly adaptable, being adjustable to accommodate a wide range part dimensions, including length, width, and height.

Refer to FIGS. 1 and 3 for an understanding of how the tube feeder accommodates various part widths. As FIG. 3 shows, the track comprises the pair of separated rails 34a and 34b, the respective outsides of which are connected to the retainer plates 35a and 35b to form respective track/retainer plate assemblies. Each of the track/retainer plate assemblies includes two through slots 299 through each of which the circumference of the head of a respective elongate track center 300 extends. Each track center 300 resembles an elongate screw, non-tapered in its shaft, and without threads. The lower, wedge-shaped surface of the head of each track center 300 contacts an upper surface of a slot 299 in each of the track/retainer plate assemblies. The lower end of the track center 300 extends downwardly through an aperture 310 in the track block 110. The aperture 310 widens into a large-diameter well 309. The tip 302 of the track center 300 has a circumferential slot in which a retaining ring 305 is seated. The retaining ring 305 retains a spring 307 between itself and the end of the well 309. The spring 307 is compressed, so that the wedge-shaped lower surface of the head of the track center 300 presses downwardly against the bottom portions of the slots in each of the track/retainer plate assemblies. The pressure of the wedge-shaped lower portion of the head is translated into a lateral force that urges the track rails 34a and 34b apart. A screw 320 is threaded between the retainer plate 35a, the track rail 34a, the track rail 34b, and the retainer plate 35b immediately adjacent each track center 300. Turning a screw 320 in one direction permits the pair of separated rails to move away from each other; turning the screw 320 in the other direction forces the two rails 34a and 34b toward each other. Since the belt assembly 38 is independent of the separated rails 34a and 34b, adjustment of the distance between the rails does not require movement of the belt assembly. Consequently, when the width of track is adjusted, the adjustment does not require movement of the belt assembly 38, yet keeps the track rails centered over the belt assembly 38. As FIGS. 3 and 6A show, the belt assembly 38 is supported on one or more upper extensions 110a of the track block 110.

Refer to FIG. 4 for an understanding of how the height of the track is adjusted with respect to the belt assembly 38. Adjusting the height of the track accommodates varying lead styles on parts that may comprise, for example, small outline integrated circuits (SOIC). In this regard consider the SOIC package 425, having leads 427. It is desirable to have the bottom surface of the SOIC package contacting the belt assembly 38, while the leads rest on, or just above the respective top edges of the track rails 34a and 34b. In order to adjust the location of the top edges of the track rails with respect the belt assembly 38, two track height eccentrics 401 are provided in the track block 110, one near each of the height-adjusting track centers 300. FIG. 4 shows the eccentric 401 that is just forward of the rearmost track center 300 in FIG. 1. The eccentric 401 rotates on a threaded screw 402. As the eccentric 401 rotates about the screw 402, the thickness of the upper wall of the eccentric changes 401. Since the bottom edges of the track rail 34a and 34b are supported on the upper walls of the eccentrics 401, the location of the top edges of the track rails can be adjusted concurrently with respect to the belt assembly 38. Thus, if the belt assembly 38 is substantially centered between the track rails 34a and 34b, in, or above a space between the rails that is characterized by a midline dimension 404 substantially centered between the rails 34a and 34b, such that the midline dimension is substantially perpendicular to the belt assembly 38, the position of the track rails 34a and 34b can be changed along the midline dimension while the belt assembly 38 remains stationary and substantially centered between the track rails 34a and 34b.

Figure 5:
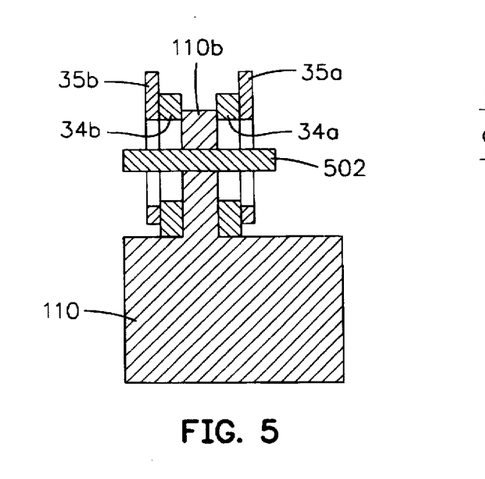
FIG. 5 is a sectional view taken along 5—5 of FIG. 1.

Referring now to FIGS. 1 and 5, a dowel pin 502 is seated in an upper extension 110b of the track block 110. The dowel pin 502 extends through respective elongate slots in the retainer plate 35a, the track rail 34a, the track rail 34b, and the retainer plate 35b, keeping the track centered so that its first end 32 remains near the feeding end 20 of the tube platform 18 and the second end 33 of the track remains near the parts stop 128.

Adjustment for the height of parts being moved along the track is provided by means illustrated in FIG. 6A, where the top guide 102 is shown positioned over the track. The position of the top guide 102, particularly its lower edge which faces the track, is adjusted with respect to the track by loosening the screws 104 and 105 that attach the top guide 102 to the mounting plate 12 by way of the spacer plates 114 and 116. Each of the mounting screws 104 and 105 extends through a slot 601, 602. When these screws are loosened, the top guide 102 can be moved in a direction toward or away from the track. Proper adjustment for the height of a part is obtained when a part is moved along the belt assembly and there is a minimum clearance between the top of the part and the bottom edge of the top guide 102. The rear position of the top guide 102 may require a different setting with respect to the track than the front in order to enable parts to exit a tube properly. If set too low, the parts may not exit the tube, if too high, parts may shingle or hang up and become wedged between the belt and the top guide. Adjustment of the top guide 102 is provided in the invention by loosening the screws 104 and 105, raising or lowering the top guide 102 as required and then retightening the screws 104 and 105.

Figure 8:
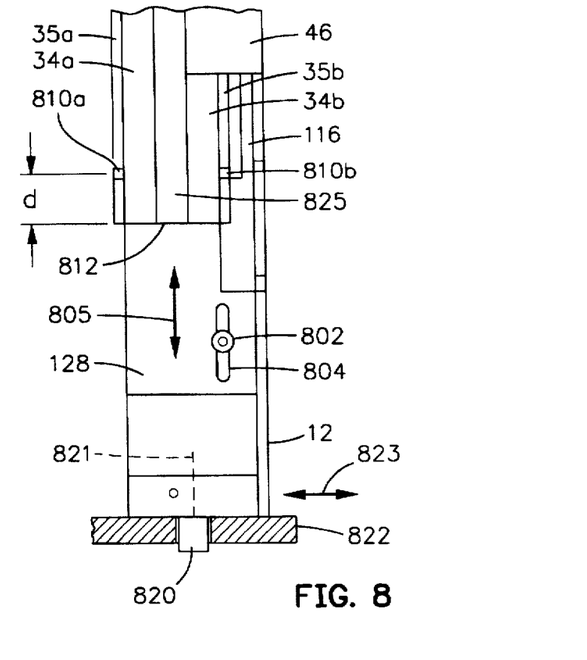
FIG. 8 is a magnified partial view of the top of the tube feeder from above its forward end.

Refer now to FIG. 8, which shows a partial magnified view of front end of the tube feeder 10 viewed from above its front end. Shown in FIG. 8 are the mounting plate 12, the track rails 34a and 34b, the retainer plates 35a and 35b that are mounted laterally to the track rails, the foot 46, and the stop 128. The stop 128 is attached to a forward extension of the track block 110 (not shown) by a threaded stop screw 802. The stop screw 802 extends through a stop slot 804 that is cut into the stop 128. When the stop screw 802 is loosened, the stop 128 can be moved toward and away from the second end of the track in the direction indicated by the arrow 805. Such movement adjusts the position of a leading edge 812 of the stop 128 with respect to a pair of V-notches 810a and 810b that are aligned laterally across the track. Each of the V-notches 810a and 810b is cut in a respective retainer plate 35a, 35b. Adjustment for part length is obtained when the length of the part is centered at the V-notches 810a and 810b. Adjustment to center a part with respect to the V-notches is made by moving the stop 128 either forward or back as required. This sets a distance d between the locus of the V-notches 810a and 810b and the forward edge 812 of the stop 128. The distance d is set to substantially one half the length of a part.

FIG. 8 also illustrates means by which the center of a part at the pick location may be adjusted with respect to the frame of an SMPS so that the tip of a vacuum quill is substantially aligned with the center of the part. As shown in FIGS. 1 and 8, an eccentric 820 is mounted to the forward lower block 14. The forward lower block 14 provides a mounting surface that engages the corresponding surface of a mounting member 822 of an SMPS. As shown best in FIG. 8, the eccentric 820 extends through an opening in the mounting member 822. When the eccentric 820 is pivoted on its axis 821, the tube feeder 10 is translated laterally with respect to the SMPS member 822 in either of the directions indicated by the arrow 823. Such adjustment permits an initial setup step in which the center 825 of a part can be substantially aligned in a plane perpendicular to the Z direction with respect to the tip of a vacuum quill in the SMPS.

Refer to FIG. 6A for an understanding of a means that sets the stroke of the belt assembly 38, that is the amount by which the belt assembly is moved with each operational cycle of the tube feeder 10. The stroke of the belt assembly is adjusted by changing the location at which the end of the clutch linkage arm 76 is connected to the third linkage arm 70. In this regard, in FIG. 6A, the end of the clutch linkage arm 76 is connected at 78, but can be connected at pivot pins 610, 612 and 614 on the third linkage arm 70, depending upon the travel of the belt assembly that is required by the length of a part. In this regard, too much stroke may destabilize the part during the drive stroke; with too little stroke, the part may not reach the pickup point.

Further illustrated in FIG. 6A are means for operating the tube platform 18. As the figure shows, an eccentric 620 is mounted on the second linkage arm 65, between the ends of the second linkage arm underneath, and in spring-forced contact with the tube platform 18. In the portion of the lower surface of the tube platform 18 that contacts the eccentric 620, there are a plurality of shallow grooves, one of which is indicated by reference numeral 622. The depth of the grooves 622 in FIG. 6A is exaggerated for purposes of illustration. The eccentric 620 sets the position of the feeding end 20 of the tube platform 18 with respect to the first end of the track. This position is changed by rotation of the eccentric 620. Proper adjustment of the feeding end 20 of the tube platform 18 with respect to the track preferably includes a minimum step down from the feeding end 20 of the tube to the first end of the track for particular kinds of parts. Too large of a step may cause the parts to lodge on the end of the tube or become jammed against the top guide 102. A too small step, or a step up, may prevent the parts from sliding out of the tube feeder under the force of gravity.

The eccentric 620 also operates against the grooves 622 as the tube feeder goes through an operational cycle. During an operational cycle, the second linkage arm pivots, causing the eccentric 620 to move over the grooves 622, thereby causing the feeding end 20 of the tube platform 18 to oscillate slightly, which shakes parts out of the tube.

Figure 9:
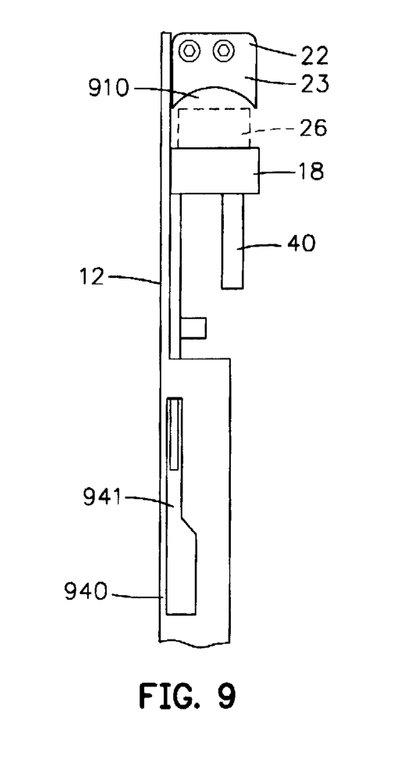
FIG. 9 is a magnified elevational view of the rear end of the tube feeder.

Refer now to FIG. 9 for an understanding of the means for centering tubes on the tube platform 18. FIG. 9 is an elevation view at the end of the tube feeder in which the retainer clamp 22 is viewed end on, displaying the clamp jaws 23. As shown in FIG. 9, the clamp jaws 23 include a concave edge 910. It is to be understood that the retainer clamp 24 also has jaws and a concave edge. The tube 26 is received in the tube feeder 10 by rotating the retainer clamps 22 and 24 upwardly, sliding the tube 26 along the upper surface of the tube platform 18, and then rotating the retainer clamps 22 and 24 so that the jaws of the clamps are brought against the top of the tube 26. As best seen in FIG. 1, a spring 912 urges the jaws of the retainer clamps 22 and 24 against the top of the tube feeder 26. The concave edges of the clamp jaws center the tube 26 with respect to the tube platform 18, thereby assuring substantial longitudinal alignment and centering of the tube with respect to the track.

Figure 10:
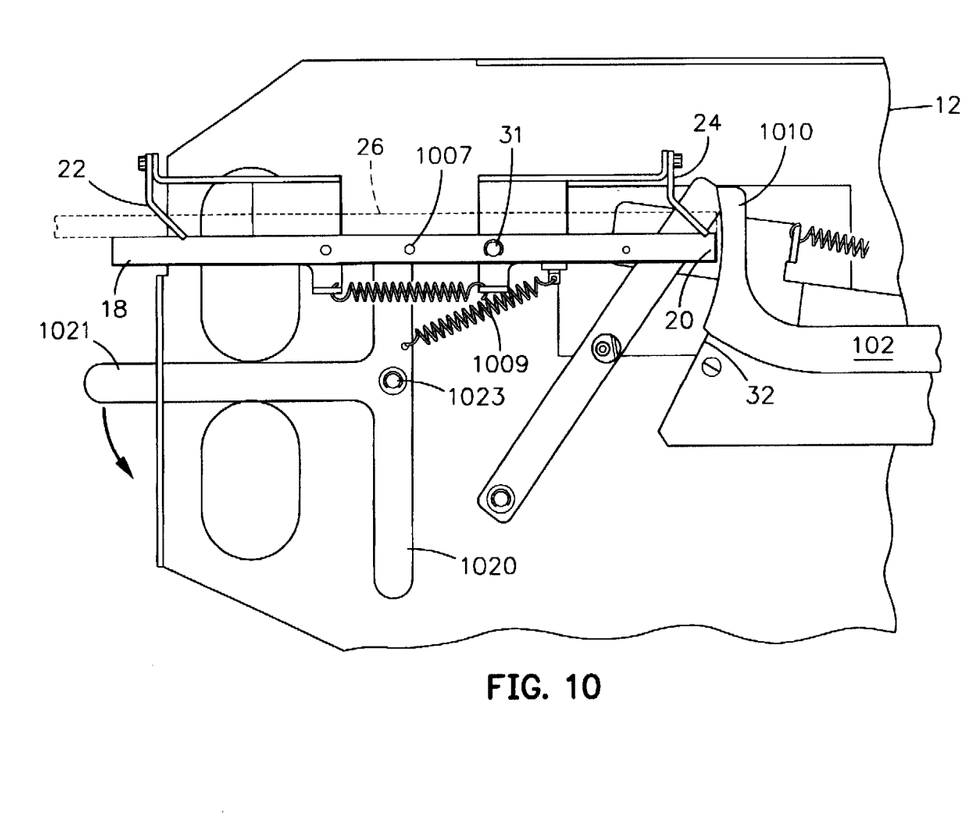
FIG. 10 is a partial elevational view of the side of the tube feeder, at its rear end.

Other functions of the tube platform 18 are shown in FIGS. 1 and 10. The tube platform 18 is pivoted on a pivot 31 that is fixed to the mounting plate 12. As FIG. 10 illustrates, the tube platform 18 can be pivoted to a horizontal position in which it is substantially parallel to the track, as opposed to its slanted position (with respect to the track) shown in FIG. 1. The tube platform 18 is locked in the horizontal position by a pin, the end of which is indicated by reference numeral 1007 in FIG. 10. The pin extends through a notch (not shown) on a side of the tube platform 18 that faces the mounting plate 12. The pin engages a hook 1008 that is partly obscured in FIG. 1 by the spring 912. The pin 1007 engages the hook 1008 to retain the tube platform 18 in its horizontal position. With a member that carries the hook 1008 is rotated (counter clockwise in FIGS. 1 and 10) the hook 1008 disengages the pin 1007 and the spring 1009, which is extended when the tube platform 18 in its horizontal position, pulls the tube to its slanted position shown in FIG. 1. Observe that, when the tube platform 18 is in its horizonal position, with a tube 26 mounted thereto, the feeding end 20 of the tube platform 18 and the end of the tube 26 from which the parts are feed to the track are brought against the curved edge of an upwardly-extending flange 1010 at the end of the top guide 102. This edge retains parts in the tube 26 until the tube platform 18 with the mounted tube 26 is rotated to the slanted position shown in FIG. 1.

With reference now to FIGS. 1, 9 and 10, the operation of loading a tube 26 into the tube feeder 10 will be explained. Initially, the tube platform 18 is rotated to and locked in its horizontal position. The tube 26 is slid through the openings defined by the concave edges of the retainer clamps 22 and 24 until the tube 26 contacts the edge of the upwardly-extending flange 1010. The tube platform 18 is then released by counter clockwise rotation of the member carrying the hook 1008, while the tube 26 is pushed towards the edge of the upwardly-extending flange 1010 to ensure proper seating. The concave edges of the retainer clamps 22 and 24 center the tube with respect to the tube platform 18 and, thus, the track. The feeding end 20 of the tube platform 18 and the end of the tube 26 have now been aligned with the first end 32 of the track, with the tube feeder in the condition illustrated in FIG. 1.

At this point, the linkage assembly (FIG. 2) can be manually operated to advance parts from the feed end 20 of the tube platform 18 along the track to the pick location in order to prepare the tube feeder for operation that responds to the previously-described components of the SMPS. For manual operation of the tube feeder 10, there is provided a T-shaped, manual indexing member 1020, having a lever 1021, and pivoted at 1023 on the mounting plate 12. As best seen in FIG. 1, the hook 1008 is in one end of the crosspiece of the T-shaped member 1020. At the other end of the crosspiece of the T-shaped member 1020 there is a pivot 1025 that connects to a manual linkage arm 1022. The manual linkage arm 1022 is connected to the clutch linkage arm 76 by a pivot pin 1027. When the manual arm 1021 is pressed in the direction of the arrow 1029 (counter clockwise in FIG. 1), the entire linkage operates as described above to cycle the tube feeder 10, advancing parts along the track until the leading part is brought against the foot 46. Note the lower edge 940 of the opening 941 in FIG. 9. This lower edge stops the travel of the manual arm 121 before the linkage moves far enough to engage the hook 85 with the hook bushing 91. The result is to prevent operation of the foot 46 during manual operation, advancing the sequence of parts far enough to require one operational cycle of the tube feeder in response to SMPS operation in order to move the first part to the pick location; normal pick and place operation begin on the following cycle. Now, the SMPS can be operated to automatically drive the operation of the tube feeder 10 as described above.

Referring again to FIG. 6A, means for adjusting the Z pickup height of the pick location with respect to the vacuum tip 121 will be described. The elements that comprise the track, the top guide 102, the shutter 100, the foot 46, and the stop 128 are mounted to be moved on the track block 110. As shown in FIG. 3, the track block 110 includes one or more upper extensions 110a on which the belts of the belt assembly 38 are supported. As shown clearly in FIG. 6A, there are three such upper extensions 110A of the track block 110. The track block 110 may be pivoted on an axis at the center of pulley 40 that engages the mounting plate 12 when the screws 630 and 631 are loosened. The screws 630 and 631 also are threadably engaged to the mounting plate 12, however they are seated in notches 632 and 633 that permit up and down adjustment of the track block 110. Such up and down adjustment is provided by rotation of the eccentric gudgeon 640 against a lower edge of the spacer member 116 that is fixed to the track block 110. In this manner, the position of the upper edge of the track block extension 110A of the pick location can be adjusted toward and away from the vacuum tip 121. Because of the engagement between the belts of the belt assembly 38, and the upper extensions 110a of the track block 110, the belt assembly is moved with this adjustment, as is a part at the pick location. This adjustment provides for selective adjustment of a part on the track with respect to a nominal Z pick height. In this regard, the top of the part at the pick location should be set so that it is coincident with the Z pick height. If the top of the part is set too low, the vacuum tip may not reach and retain the part.

Refer to FIGS. 1, 2, and 6A for an understanding of a means for adjusting the operation of the foot 46. In this regard, the eccentric gudgeon 86 may be rotated. The position to which the gudgeon 86 is rotated initially positions the cam surface 87 so the degree to which the hook bushing 91 is positioned within the hook 85 may be determined. The deeper the hook bushing 91 is initially positioned within the hook 85, the longer the hook 85 will engage the bushing 91 when the linkage illustrated in FIG. 2 is operated. This determines the degree to which the foot arm 90 is rotated and thereby the length of the arc by which the foot 46 is rotated away from the belt assembly 38. Stated differently, the eccentric 86 sets the point at which the foot 46 is released and allowed to swing down to separate a trailing part from a part of the pick location. Further adjustment of the foot 46 is provided by threaded screws 88 that are shown in FIG. 2. These screws attach the foot 46 to the top of the foot arm 90. When loosened, they permit the location of the foot 46 to be adjusted with respect to the stop 128, so that the foot may be moved nearer to or away from the stop 128 and nearer to or further away from the belt assembly 38. The position of the foot 46 depends on the length of a part. Adjustment in this direction, coupled with adjustment of the eccentric 86, permits the dwell time of the foot 46 on a part to be adjusted. If the dwell time is too long, the foot 46 may clamp a part against the belts of the belt assembly 38 long enough for the belts to stretch before the part is unclamped. The result would be that the part would be shot forward and possibly turned on end against the stop 128. In fact, the forward and back adjustment of the foot 46 may even permit the foot 46 to overlap and clamp two parts.

Obviously, many variations of the invention will be evident to the skilled practitioner and may be implemented without departing from the spirit of scope of this invention which is limited only by the following claims.

We claim:

1. A tube feeder for an assembly system, comprising:

a tube platform having a feeding end for feeding a sequence of parts contained in a tube;

a track having a first end for receiving parts and a second end for providing parts, the feeding end of the tube platform positioned near the first end;

a belt assembly for moving parts from the first to the second end of the track;

a belt drive assembly that intermittently drives the belt assembly;

a foot for separating a part near the second end of the track from other parts on the track;

an actuator lever for being pivoted between a first position and a second position; and a linkage coupling the actuator lever to the belt drive assembly and the foot for moving the belt assembly and operating the foot in response to the actuator lever being pivoted between the first and the second position.

2. The tube feeder of claim 1, further comprising:

a shutter moveable over the track;

the linkage coupling the actuator lever to the shutter;

the linkage moving the shutter to a first position when the actuator lever is pivoted to the first position and moving the shutter to a second position when the actuator lever is pivoted to the second position; and the shutter extending over a part on the track between the foot and the second end when being moved to the second position, and uncovering the part near the second end when being moved from the second to the first position.

3. The tube feeder of claim 1, wherein the track comprises a pair of separated rails, the belt assembly being substantially centered between the rails.

4. The tube feeder of claim 3, wherein the tube feeder further comprises means for changing a distance between the rails such that the belt assembly remains substantially centered between the rails.

5. The tube feeder of claim 3, further including a space between the rails within which the belt assembly is disposed, the space being characterized by a midline dimension substantially centered between the rails and substantially perpendicular to the belt assembly.

6. The tube feeder of claim 5, further including means for changing a position of the rails along the midline dimension such that the belt assembly remains substantially centered between the rails.

7. The tube feeder of claim 2, further including a top guide parallel to the track and positioned with respect to the track for retaining parts on the belt assembly while the parts are being moved by the belt assembly from the first toward the second end.

8. The tube feeder of claim 7, wherein the shutter is movably mounted to the top guide.

9. The tube feeder of claim 8, further including means for changing the position of the top guide and the shutter with respect to the track.

10. The tube feeder of claim 1, further including a stop on the track substantially at the second end for retaining a part at a pick location between the foot and the second end.

11. The tube feeder of claim 1, further including a pivot, the tube platform being mounted to the pivot for being moved between a first position in which the tube platform and track are substantially parallel and the feeding end is separated from the first end, and a second position in which the tube platform is inclined with respect to the track and the feeding end is positioned near the first end.

12. The tube feeder of claim 11 including means coupled to the linkage for shaking the tube platform in response to the actuator lever being pivoted.

13. The tube feeder of claim 11, further including means for centering a tube on the tube platform.

14. The tube feeder of claim 1, further including means for manual operation of the linkage.

15. The tube feeder of claim 15, wherein the means for manual operation is for operating the belt assembly without operating the foot.

16. The tube feeder of claim 10, further including a pivot, the track being mounted to the pivot for pivoting thereon to adjust a Z position of the pick location.

17. The tube feeder of claim 1, further including:

a pivot;

a foot arm being mounted to the pivot for pivoting the foot in an arc toward and away from the belt assembly in response to the actuator lever being pivoted; and an eccentric engaging the linkage for adjusting the length of the arc.

18. The tube feeder of claim 17, the foot being mounted to the foot arm for being pivoted therewith, further including a mechanism permitting adjustment of the foot on the foot arm toward and away from the second end of the track.

19. The tube feeder of claim 1, further including stroke adjustment mechanism acting between the linkage and the belt drive assembly for adjusting an amount by which the belt assembly is driven in response to the actuator lever being pivoted.

20. The tube feeder of claim 1, the actuator lever including an arm for engaging an assembly machine drive actuator to operate the tube feeder.

* * * * *

UNITED STATES PATENT AND TRADEMARK OFFICE
CERTIFICATE OF CORRECTION

PATENT NO. : 5,755,548
DATED      : May 26, 1998
INVENTOR(S) : Gaasch et al

It is certified that error appears in the above-indentified patent and that said Letters Patent is hereby corrected as shown below:

On title page, item:    [73], change "San Marco" to --San Marcos--.

Col. 12, line 43, insert --a-- between "including" and "stroke"

Signed and Sealed this

Sixth Day of October, 1998

Attest:

Attesting Officer

BRUCE LEHMAN

Commissioner of Patents and Trademarks